United States Patent
Isoda

[11] Patent Number: 6,058,487
[45] Date of Patent: May 2, 2000

[54] PERIOD MEASURING CIRCUIT WITH MAXIMUM FREQUENCY CUTOFF

[75] Inventor: Kazunari Isoda, Tokyo, Japan

[73] Assignee: NEC Corporation, Tokyo, Japan

[21] Appl. No.: 09/089,665

[22] Filed: Jun. 3, 1998

[30] Foreign Application Priority Data

Jun. 6, 1997 [JP] Japan .................................... 9-149225

[51] Int. Cl.⁷ ..................................................... G06F 1/04
[52] U.S. Cl. ............................................................ 713/502
[58] Field of Search .................................. 713/500, 502; 702/78, 79

[56] References Cited

U.S. PATENT DOCUMENTS 4,965,502 10/1990 Ogasawara ................................ 318/628
4,994,723 2/1991 Tabuchi .................................... 318/569

FOREIGN PATENT DOCUMENTS 8-210875  8/1996  Japan .

OTHER PUBLICATIONS

Siemens: CR167 User's Manual, Munich, Feb. 1996, pp. 2–1, 2–14, 9–1, 9–16, 9–17, 9–20, 9–23, 9–24, 9–28.

*Primary Examiner*—Thomas M. Heckler
*Attorney, Agent, or Firm*—Young & Thompson

[57] ABSTRACT

The present invention provides a period measuring circuit comprising: a timer for receiving a timer count clock signal and executing a counting operation; a detection circuit receiving an input signal to detect an edge of the input signal and output a detection signal; a capture register connected to the detection circuit and also to the timer to capture a current value counted by the timer upon receipt of the detection signal; and a control circuit connected between the detection circuit and the capture register, the control circuit comparing a frequency of the detection signal with a predetermined critical frequency value and if the frequency of the detection signal exceeds the critical frequency, then the capture register is disconnected from the detection circuit to terminate period measurement, and if the frequency of the detection signal does not exceed the critical frequency, the control circuit connects the capture register to the detection circuit whereby the capture register receives the detection signal and simultaneously clears the timer.

22 Claims, 6 Drawing Sheets

PERIOD MEASURING CIRCUIT WITH MAXIMUM FREQUENCY CUTOFF

BACKGROUND OF THE INVENTION

The present invention relates to a period measuring circuit, and more particularly to a period measuring circuit using a timer.

FIG. 1 is a block diagram illustrative of a conventional period measuring circuit. The conventional period measuring circuit has an external trigger signal input terminal 101 to which an input trigger signal S1 is inputted. The conventional period measuring circuit also has a period measuring circuit section 102 which is connected to the external trigger signal input terminal 101 for receipt of the input trigger signal S1. The period measuring circuit section 102 is also configured to receive a timer count clock signal T1 so that the period measuring circuit section 102 is operated in accordance with the timer count clock signal T1. The conventional period measuring circuit also has a central processing unit 100 which is connected to the period measuring circuit section 102 for receiving informations from the period measuring circuit section 102 and also sends control signals S2 to the period measuring circuit section 102 for control of operations of the period measuring circuit section 102.

FIG. 2 is a block diagram illustrative of a conventional period measuring circuit section in the conventional period measuring circuit of FIG. 1. The period measuring circuit section 102 has a timer 103 which receives the timer count clock signal T1 for performing the counting operation in n-bit length (n≧1) based upon the timer count clock signal T1. The timer 103 is also connected to the central processing unit 100. The timer 103 has a predetermined counting capability. If a value counted by the timer 103 exceeds the predetermined counting capability, then the timer 103 outputs a timer overflow signal S3 which will be transmitted to the central processing unit 100 so as to notify the central processing unit 100 of the overflow. The period measuring circuit section 102 also has an edge detection circuit 109 which is connected to the external trigger signal input terminal 101 for receipt of the input trigger signal S1 so as to detect a rising edge of the input trigger signal S1 or a falling edge thereof or both rising and falling edges of the input trigger signal S1. The edge detection circuit 109 outputs an edge detection signal. The period measuring circuit section 102 also has a capture register 104 which is connected to the edge detection circuit 109 for receipt of the edge detection signal from the edge detection circuit 109 as a trigger signal for the following capturing operation. Further, the capture register 104 is of an m-bit length (m≧1). The capture register 104 is also connected to the timer 103 for capturing the currently counted value by the timer 103 in accordance with the edge detection signal having been received as a trigger signal from the edge detection circuit 109. The period measuring circuit section 102 also has a first random access memory 105 of x-bits (x≧1) which is connected to the capture register 104 for receiving the currently counted value from the capture register 104 to store the currently counted value therein until the capture register 104 captures the next counted value from the timer 103 upon receipt of the next trigger signal of the edge detection signal from the edge detection circuit 109. The period measuring circuit section 102 also has a second random access memory 106 of y-bits (y≧1) which is connected to the first random access memory 105 for receiving the previously counted value from the first random access memory 105 to store the previously counted value therein until the capture register 104 captures the next counted value from the timer 103 upon receipt of the next trigger signal of the edge detection signal from the edge detection circuit 109. The above first and second random access memories 105 and 106 are connected to the central processing unit 100 for allowing the central processing unit 100 to fetch the currently counted value from the first random access memory 105 and also fetch the previously counted value from the second random memory 106 for subsequent subtraction operation of the previously counted value from the currently counted value. The period measuring circuit section 102 also has a third random access memory 107 of z-bits (z≧1) which is connected to the central processing unit 100 for storing the subtraction result form the central processing unit 100.

FIG. 3 is a flow chart illustrative of operations of the conventional period measuring circuit of FIG. 1. With reference to FIG. 3, the operations of the above conventional period measuring circuit will be described as follows.

In a first step S101, the edge detection circuit 109 monitors the input signal S1 having been inputted to the external trigger signal input terminal 101 in order to detect a predetermined waveform pulse signal, for example, a rising edge, a falling edge or both.

In the second step S102, if the edge detection circuit 109 confirms the input of the predetermined waveform pulse signal, then the edge detection circuit 109 sends an edge detection signal as a trigger signal to the capture register 104, whereby the capture register 104 captures the currently counted value counted by the timer 103 in accordance with the edge detection signal having been received as a trigger signal from the edge detection circuit 109. The central processing unit 100 transfers the currently counted value having now been captured by the capture register 104 to the first random access memory 105.

In the third step S103, the central processing unit 100 transfers the previously counted value from the first random access memory 105 to the second random access memory 106, wherein the previously counted value had been counted by the timer 103 in the previous counting operation thereof and then stored in the first random access memory 105 until the currently counted value has been counted by the timer 103 in the present counting operation and having been now transferred through the capture register 104 to the first random access memory 105. The central processing unit 100 performs a subtraction operation to subtract the previously counted value stored in the second random access memory 106 from the currently counted value stored in the first random access memory 105.

In the fourth step S104, the central processing unit 100 confirms continuously whether or not the over-flow signal S3 has been received from the timer 103 so as to confirm whether or not the timer 103 is in over-flow state.

In the fifth step S105, if the over-flow state of the timer 103 was confirmed by the central processing unit 100, then the central processing unit 100 sends an instruction to the period measuring circuit section 102 to discontinue the currently executed frequency measurement operation. This currently executed program enters another routine. The contents to be executed in the other routine depend upon the contents of the device or apparatus for which the period measuring circuit is utilized, but are independent from the operations of the period measuring circuit.

In the sixth step S106, if no over-flow state of the timer 103 could be confirmed by the central processing unit 100, then the central processing unit 100 sends the subtraction result obtained in the above third step S103 to the third random access memory 107 whereby the third random access memory 107 stores the subtraction result.

In the seventh step S107, the central processing unit 100 writes the counted value stored in the first random access memory 105 to the second random access memory 106 as the previously counted value.

After the seventh step S107, the operation of the period measuring circuit will be back to the above first step S101 so that the edge detection circuit 109 monitors the input signal S1 having been inputted to the external trigger signal input terminal 101 in order to detect the predetermined waveform pulse signal, for example, the rising edge, the falling edge or both.

The above period measuring circuit has the following problems. In accordance with the above conventional period measuring circuit, even when the edge detection circuit 109 could detect the predetermined waveform pulse signal, for example, the rising edge, the falling edge or both, then the period measuring operation will be made during which the central processing unit 100 operates measuring the frequency. This means that every time the edge detection circuit 109 detects the predetermined waveform pulse signal, for example, the rising edge, the falling edge or both, then the central processing unit 100 is shared and becomes engaged with the period measuring operations.

It is further necessary for the above conventional period measuring circuit that the central processing unit 100 also operates to selectively remove shorter-frequency signals than the measuring frequency range from the inputted signals having been inputted to the external trigger signal input terminal 101.

Furthermore, it is difficult to judge from the capture value whether or not the over-flow of the timer 103 has appeared, for which reason the central processing unit 100 is also required to refer over-flow bits in order to confirm whether the timer 103 is in the over-flow state.

From the above descriptions, it can be understood that the burden upon the central processing unit 100 is heavy.

In the above circumstances, it had been required to develop a novel period measuring circuit free from the above problems and disadvantages.

SUMMARY OF THE INVENTION

Accordingly, it is an object of the present invention to provide a novel period measuring circuit free from the above problems.

It is a further object of the present invention to provide a novel period measuring circuit which is capable of accurately measuring the frequency in a wide frequency range.

It is a still further object of the present invention to provide a novel period measuring circuit allowing a considerable reduction in burden to the central processing unit for controlling period measuring operations.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
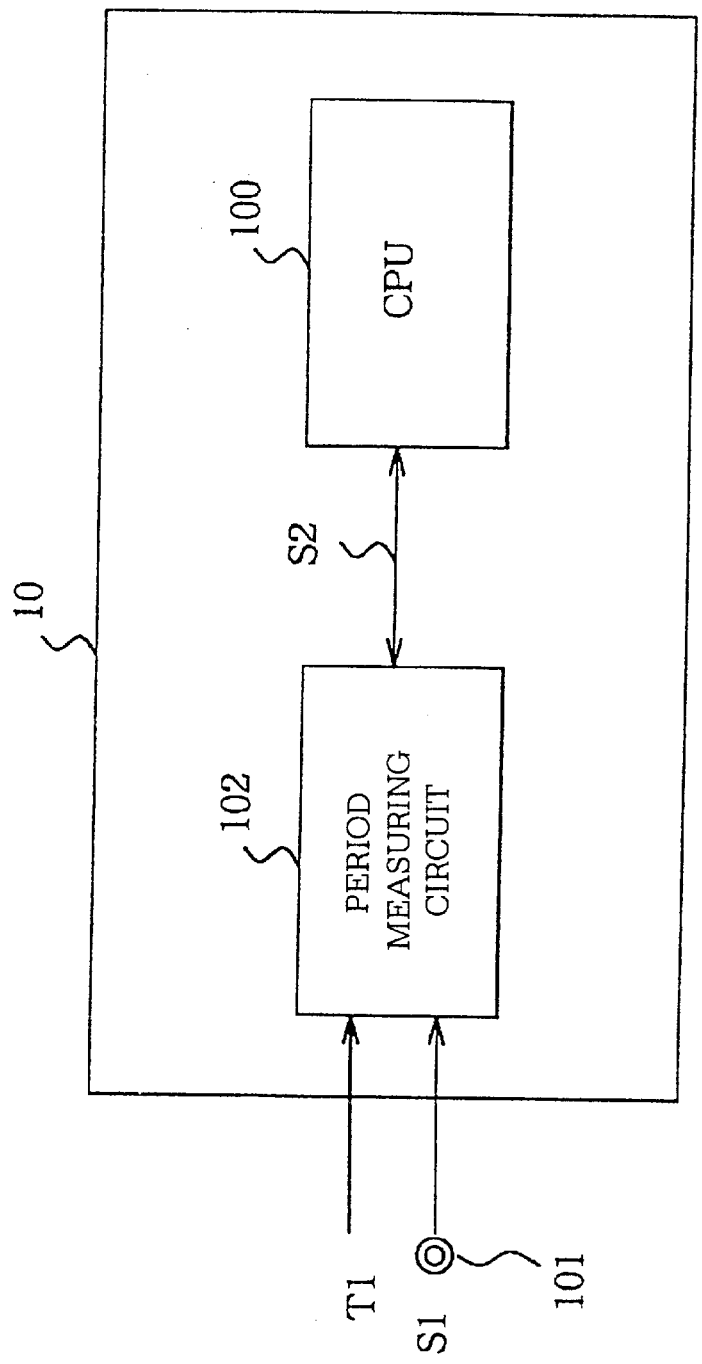
FIG. 1 is a block diagram illustrative of the conventional period measuring circuit.
Figure 2:
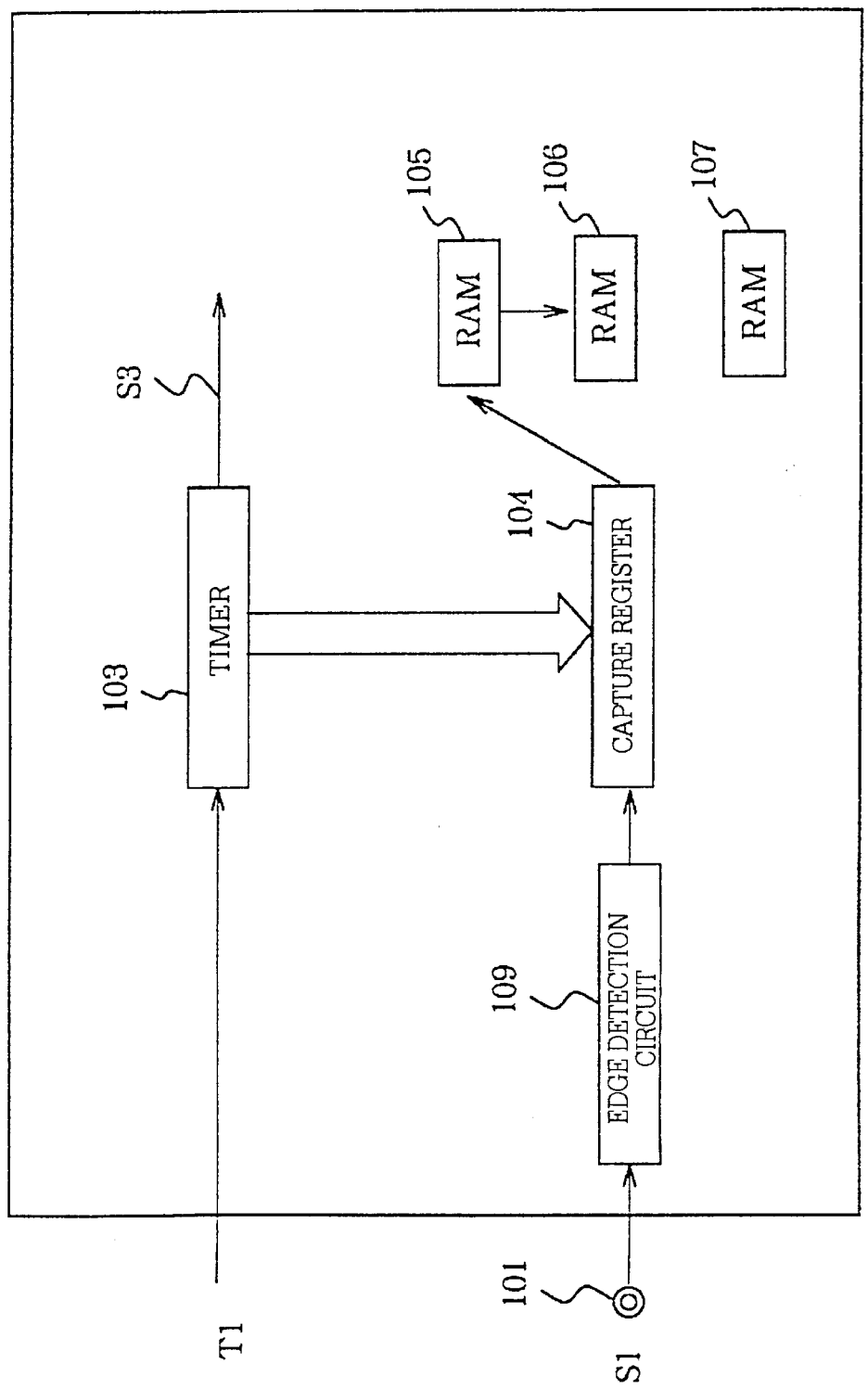
FIG. 2 is a block diagram illustrative of the conventional period measuring circuit section in the conventional period measuring circuit of FIG. 1.
Figure 3:
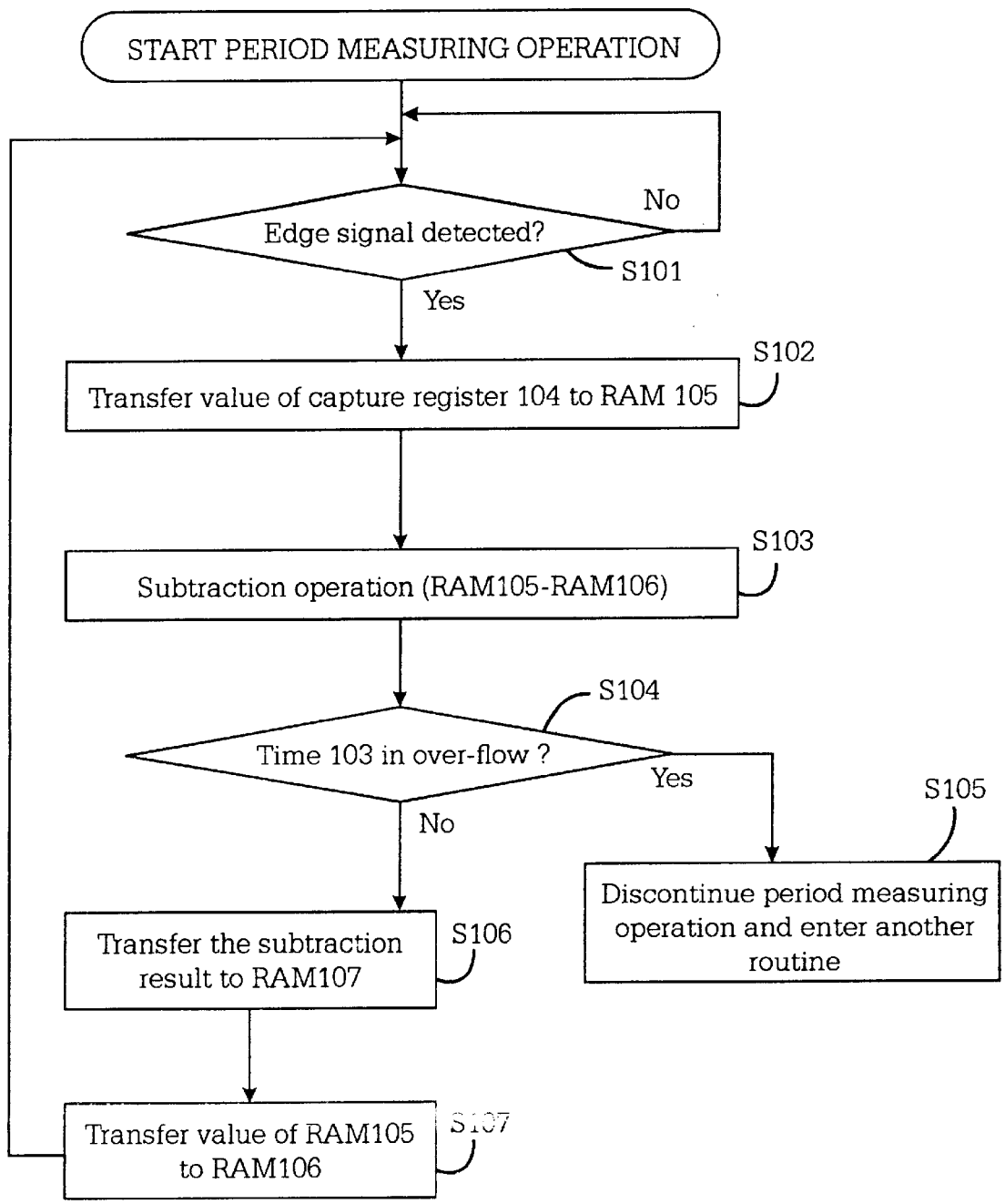
FIG. 3 is a flow chart illustrative of operations of the conventional period measuring circuit of FIG. 1.

The first embodiment of the present invention provides a period measuring circuit connected to a central processing unit. The period measuring circuit comprises: a timer for receiving a timer count clock signal and executing a counting operation; a detection circuit connected to an input terminal for receiving an input signal in order to detect at least one of a rising edge and falling edge of the input signal and output a detection signal; a capture register connected to the detection circuit and also to the timer for capture a currently counted value which has now been counted by the timer in accordance with receipt of the detection signal as a capture trigger signal from the detection circuit; and a control circuit connected between the detection circuit and the capture register, the control circuit having a predetermined critical frequency value so that the control circuit is operated to receive the detection signal from the detection circuit for comparison of a frequency of the detection signal with the predetermined critical frequency value and if the frequency of the detection signal is beyond the predetermined critical frequency value, then the control circuit is operated to disconnect the capture register from the detection circuit whereby a period measuring operation is discontinued, and if the frequency of the detection signal is not beyond the predetermined critical frequency value, then the control circuit is operated to connected the capture register to the detection circuit whereby the capture register receives the detection signal as the capture trigger signal and simultaneously sends a counting value clear signal to the timer so that the timer makes a currently counting value clear to an initial value and subsequently re-starts its counting operation.

It is preferable that the control circuit further comprises: a filter circuit connected between the detection circuit and the capture register, and the filter circuit being operated to connect or disconnect the capture register to the detection circuit; and a compare register connected to the detection circuit and also connected to the filter circuit, the compare register having stored the predetermined critical frequency value for comparison of a frequency of the detection signal with the predetermined critical frequency value and if the frequency of the detection signal is beyond the predetermined critical frequency value, then the compare register sends an invalid signal to the filter circuit so that the filter circuit is operated to disconnect the capture register from the detection circuit whereby a period measuring operation is discontinued, and if the frequency of the detection signal is not beyond the predetermined critical frequency value, then the compare register sends a valid signal to the filter circuit so that the filter circuit is operated to connect the capture register to the detection circuit whereby the capture register receives the detection signal as the capture trigger signal and simultaneously sends a counting value clear signal to the timer so that the timer makes a currently counting value clear to an initial value and subsequently re-starts its counting operation.

It is also preferable that the timer is connected to an input side of the capture register and also has a predetermined counting capability so that if a currently counted value made by the timer exceeds the predetermined counting capability, then the timer sends an over-flow signal to the capture register so that the capture register is operated to capture a previously counted value made by the timer in a previous counting operation, in place of the currently counted value.

By synchronizing with the capture trigger signal or the edge detection signal, the currently counting value of the timer is cleared and the counting operation of the timer is re-started whereby it is possible to have the capture register store the currently counted value without execution of the subtraction operation by the central processing unit. This reduces the burden of the central processing unit.

The filter circuit and the compare register are provided to limit the frequency of the signal to be measured or to discontinue the transmission of the edge detection signal as the capture trigger signal from the edge detection circuit to the capture register when the frequency defined to be a rise-time or a fall-time of the edge detection signal received as the trigger signal is beyond the predetermined critical frequency value stored in the compare register. If a pulse signal having a shorter wavelength than a detectable wavelength range is applied to the external trigger signal input terminal due to noise, then the period measuring operation is not executed. This means that if a pulse signal having a shorter wavelength than a detectable wavelength range is applied to the external trigger signal input terminal due to noise, then no signal is sent to the capture register, whereby no period measuring operation is executed. This frees the central processing unit from any heavy burden for executing the period measuring operation.

Further, the capture register receives from the timer the over-flow signal as a capture trigger signal identifying that the timer has fallen into the over-flow state. If the counted value by the timer exceeds the predetermined counting capability, then the timer sends the timer overflow signal to the capture register so that the capture register captures the previously counted value by the timer. This makes it possible to free the central processing unit from the requirement for monitoring the over-flow signal. This reduces the burden of the central processing unit.

The second embodiment of the present invention provides a period measuring circuit connected to a central processing unit. The period measuring circuit comprises: a timer for receiving a timer count clock signal and executing a counting operation; a detection circuit connected to an input terminal for receiving an input signal in order to detect at least one of rising edge and falling edge of the input signal and output a detection signal; and a capture register connected to the detection circuit and also to the timer for capture a currently counted value which has now been counted by the timer in accordance with receipt of the detection signal as a capture trigger signal from the detection circuit, wherein the capture register is operated to send a counting value clear signal to the timer upon receipt of the detection signal, so that the timer clears a counting value to an initial value and subsequently re-starts its counting operation.

It is preferable to further provide a control circuit connected between the detection circuit and the capture register, the control circuit having a predetermined critical frequency value so that the control circuit is operated to receive the detection signal from the detection circuit for comparison of a frequency of the detection signal with the predetermined critical frequency value and if the frequency of the detection signal is beyond the predetermined critical frequency value, then the control circuit is operated to disconnect the capture register from the detection circuit whereby a period measuring operation is discontinued, and if the frequency of the detection signal is not beyond the predetermined critical frequency value, then the control circuit is operated to connect the capture register to the detection circuit whereby the capture register receives the detection signal as the capture trigger signal.

It is also preferable that the control circuit further comprises: a filter circuit connected between the detection circuit and the capture register, and the filter circuit being operated to connect or disconnect the capture register to the detection circuit; and a compare register connected to the detection circuit and also connected to the filter circuit, the compare register having stored the predetermined critical frequency value for comparison of a frequency of the detection signal with the predetermined critical frequency value and if the frequency of the detection signal is beyond the predetermined critical frequency value, then the compare register sends an invalid signal to the filter circuit so that the filter circuit is operated to disconnect the capture register from the detection circuit whereby a period measuring operation is discontinued, and if the frequency of the detection signal is not beyond the predetermined critical frequency value, then the compare register sends a valid signal to the filter circuit so that the filter circuit is operated to connect the capture register to the detection circuit whereby the capture register receives the detection signal as the capture trigger signal and simultaneously sends a counting value clear signal to the timer so that the timer makes a currently counting value clear to an initial value and subsequently re-starts its counting operation.

It is also preferable that the timer is connected to an input side of the capture register and also has a predetermined counting capability so that if a currently counted value made by the timer exceeds the predetermined counting capability, then the timer sends an over-flow signal to the capture register so that the capture register is operated to capture a previously counted value made by the timer in a previous counting operation, in place of the currently counted value.

By synchronizing with the capture trigger signal or the edge detection signal, the currently counting value of the timer is cleared and the counting operation of the timer is re-started whereby it is possible to have the capture register store the currently counted value without execution of the subtraction operation by the central processing unit. This reduces the burden of the central processing unit.

The filter circuit and the compare register are provided to limit the frequency of the signal to be measured or to discontinue the transmission of the edge detection signal as the capture trigger signal from the edge detection circuit to the capture register when the frequency defined to be a rise-time or a fall-time of the edge detection signal received as the trigger signal is beyond the predetermined critical frequency value stored in the compare register. If a pulse signal having a shorter wavelength than a detectable wavelength range is applied to the external trigger signal input terminal due to noise, then the period measuring operation is not executed. This means that if a pulse signal having a shorter wavelength than a detectable wavelength range is applied to the external trigger signal input terminal due to noise, then no signal is sent to the capture register, whereby no period measuring operation is executed. This frees the central processing unit from any heavy burden for executing the period measuring operation.

Further, the capture register receives from the timer the over-flow signal as a capture trigger signal identifying that the timer has fallen into the over-flow state. If the counted value by the timer exceeds the predetermined counting capability, then the timer sends the timer overflow signal to the capture register so that the capture register captures the previously counted value by the timer. This makes it possible to free the central processing unit from the requirement for monitoring the over-flow signal. This reduces the burden of the central processing unit.

The third embodiment of the present invention provides a period measuring circuit connected to a central processing unit. The period measuring circuit comprises: a timer for receiving a timer count clock signal and executing a counting operation; a detection circuit connected to an input terminal for receiving an input signal in order to detect at least one of rising edge and falling edge of the input signal and output a detection signal; and a capture register connected to the detection circuit and also to the timer for capture a currently counted value which has now been counted by the timer in accordance with receipt of the detection signal as a capture trigger signal from the detection circuit, wherein the timer is connected to an input side of the capture register and also has a predetermined counting capability so that if a currently counted value made by the timer exceeds the predetermined counting capability, then the timer sends an over-flow signal to the capture register so that the capture register is operated to capture a previously counted value made by the timer in a previously counting operation, in place of the currently counted value.

It is preferable that the capture register is operated to send a counting value clear signal to the timer upon receipt of the detection signal, so that the timer makes a currently counting value clear to an initial value and subsequently re-starts its counting operation.

It is also preferable to further provide a control circuit connected between the detection circuit and the capture register, the control circuit having a predetermined critical frequency value so that the contort circuit is operated to receive the detection signal from the detection circuit for comparison of a frequency of the detection signal with the predetermined critical frequency value and if the frequency of the detection signal is beyond the predetermined critical frequency value, then the control circuit is operated to disconnect the capture register from the detection circuit whereby a period measuring operation is discontinued, and if the frequency of the detection signal is not beyond the predetermined critical frequency value, then the control circuit is operated to connect the capture register to the detection circuit whereby the capture register receives the detection signal as the capture trigger signal.

It is also preferable that the control circuit further comprises: a filter circuit connected between the detection circuit and the capture register, and the filter circuit being operated to connect or disconnect the capture register to the detection circuit; and a compare register connected to the detection circuit and also connected to the filter circuit, the compare register having stored the predetermined critical frequency value for comparison of a frequency of the detection signal with the predetermined critical frequency value and if the frequency of the detection signal is beyond the predetermined critical frequency value, then the compare register sends an invalid signal to the filter circuit so that the filter circuit is operated to disconnect the capture register from the detection circuit whereby a period measuring operation is discontinued, and if the frequency of the detection signal is not beyond the predetermined critical frequency value, then the compare register sends a valid signal to the filter circuit so that the filter circuit is operated to connect the capture register to the detection circuit whereby the capture register receives the detection signal as the capture trigger signal and simultaneously sends a counting value clear signal to the timer so that the timer makes a currently counting value clear to an initial value and subsequently re-starts its counting operation.

By synchronizing with the capture trigger signal or the edge detection signal, the currently counting value of the timer is cleared and the counting operation of the timer is re-started whereby it is possible to have the capture register store the currently counted value without execution of the subtraction operation by the central processing unit. This reduces the burden of the central processing unit.

The filter circuit and the compare register are provided to limit the frequency of the signal to be measured or to discontinue the transmission of the edge detection signal as the capture trigger signal from the edge detection circuit to the capture register when the frequency defined to be a rise-time or a fall-time of the edge detection signal received as the trigger signal is beyond the predetermined critical frequency value stored in the compare register. If a pulse signal having a shorter wavelength than a detectable wavelength range is applied to the external trigger signal input terminal due to noise, then the period measuring operation is not executed. This means that if a pulse signal having a shorter wavelength than a detectable wavelength range is applied to the external trigger signal input terminal due to noise, then no signal is sent to the capture register, whereby no period measuring operation is executed. This frees the central processing unit from any heavy burden for executing the period measuring operation.

Further, the capture register receives from the timer the over-flow signal as a capture trigger signal identifying that the timer has fallen into the over-flow state. If the counted value by the timer exceeds the predetermined counting capability, then the timer sends the timer overflow signal to the capture register so that the capture register captures the previously counted value by the timer. This makes it possible to free the central processing unit from the requirement for monitoring the over-flow signal. This reduces the burden of the central processing unit.

PREFERRED EMBODIMENTS

First Embodiment

A first embodiment according to the present invention will be described in detail with reference to FIG. 4 which is a block diagram illustrative of a novel period measuring circuit. The novel period measuring circuit has an external trigger signal input terminal 210 to which an input trigger signal S11 is inputted. The novel period measuring circuit also has a period measuring circuit section 220 which is connected to the external trigger signal input terminal 210 for receipt of the input trigger signal S11. The period measuring circuit section 220 is also configured to receive a timer count clock signal T11 so that the period measuring circuit section 220 is operated in accordance with the timer count clock signal T11. The novel period measuring circuit also has a central processing unit 200 which is connected to the period measuring circuit section 220 for receiving informations from the period measuring circuit section 220 and also sends control signals S12 to the period measuring circuit section 220 for control of operations of the period measuring circuit section 220.

Figure 4:
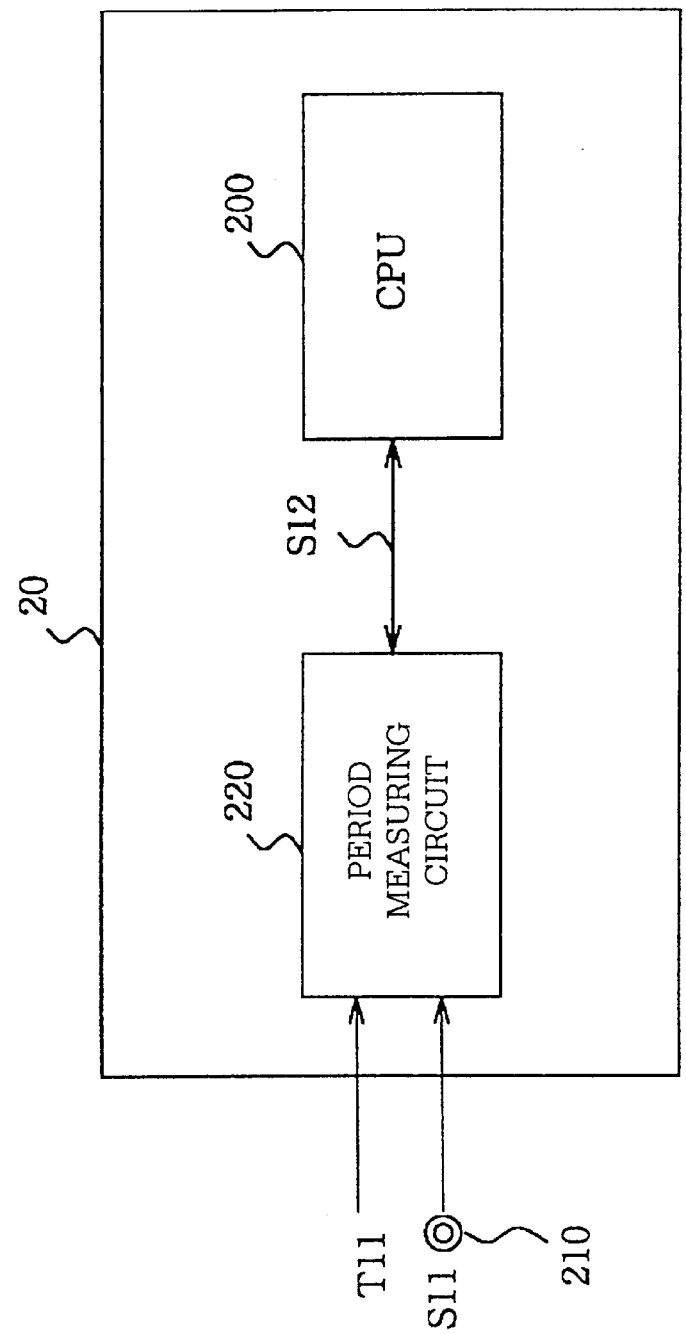
FIG. 4 is a block diagram illustrative of a novel period measuring circuit in a preferred embodiment in accordance with the present invention.
Figure 5:
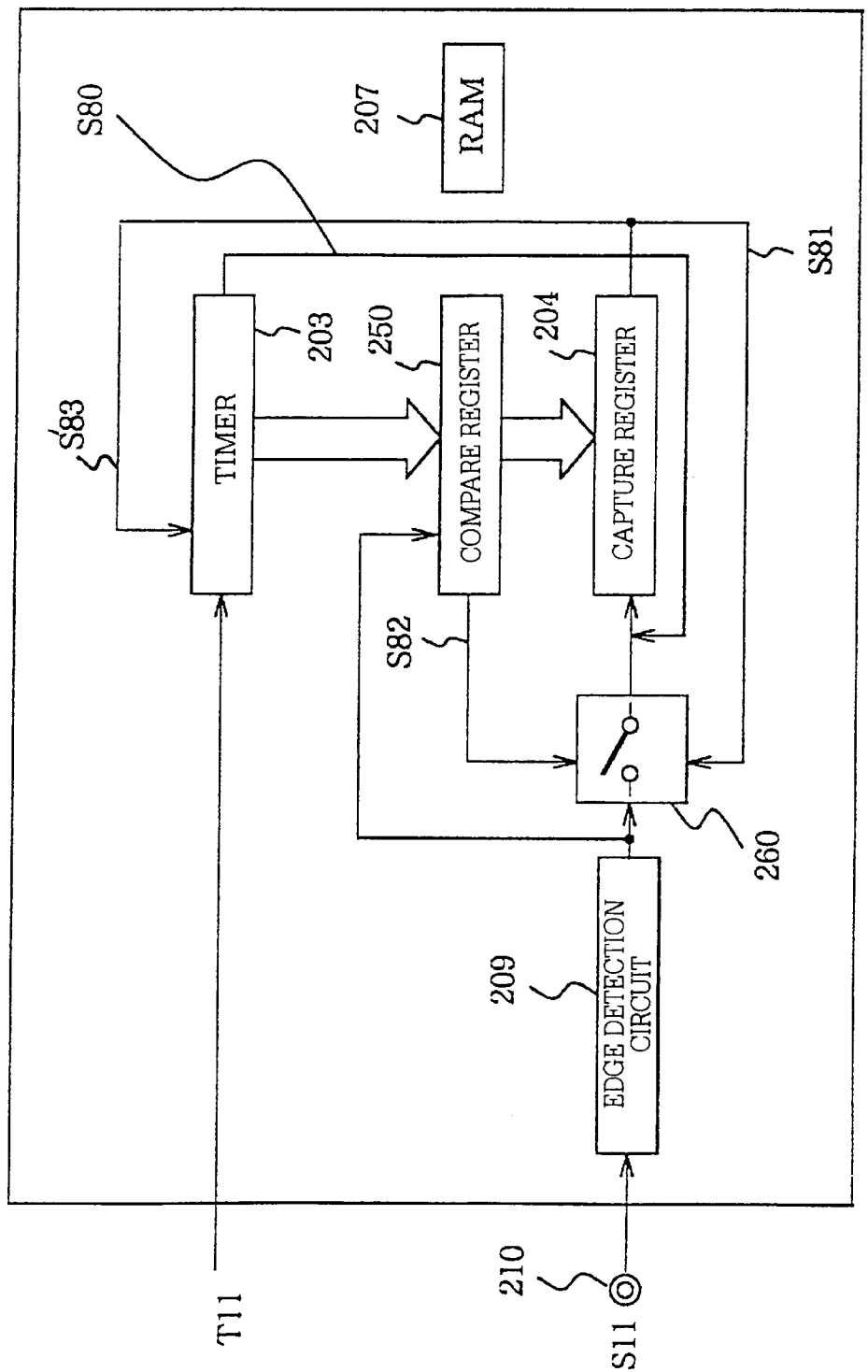
FIG. 5 is a block diagram illustrative of the conventional period measuring circuit section in the novel period measuring circuit of FIG. 4.

FIG. 5 is a block diagram illustrative of a novel period measuring circuit section in the novel period measuring circuit of FIG. 4. The period measuring circuit section 220 has a timer 203 which receives the timer count clock signal T11 for performing the counting operation in n-bit length (n≧1) based upon the timer count clock signal T11. The timer 203 has a predetermined counting capability. If a value counted by the timer 203 exceeds the predetermined counting capability, then the timer 203 outputs a timer overflow signal S80.

The period measuring circuit section 220 also has an edge detection circuit 209 which is connected to the external trigger signal input terminal 210 for receipt of the input trigger signal S11 so as to detect a rising edge of the input trigger signal S11 or a falling edge thereof or both a rising edge and a falling edge of the input trigger signal S11. The edge detection circuit 209 outputs an edge detection signal.

The period measuring circuit section 220 also has a filter circuit 260, a capture register 204 and a compare register 250. The filter circuit 260 is connected to the edge detection circuit 209 for receipt of the edge detection signal from the edge detection circuit 209 as a trigger signal. The filter circuit 260 is operated to confirm a valid state of an invalid state in accordance with control signals S81 an S82 from the capture register 204 and the compare register 250 respectively, so that only when the valid state is confirmed, the filter circuit 260 allows transmission of the edge detection signal from the edge detection circuit 209 to the capture register 204.

The capture register 204 is connected to the filter circuit 260 for receipt of the edge detection signal transmitted through the filter circuit 260 from the edge detection circuit 209 as a trigger signal only when the valid state is confirmed by the filter circuit 260 for the following capturing operation. Further, the capture register 204 is of an m-bit length (m≧1). The capture register 204 is operated to capture the currently counted value counted by the timer 203 in accordance with the edge detection signal received as a trigger signal through the filter circuit 260 from the edge detection circuit 209. The capture register 204 stores the currently counted value together with the previously counted value, wherein the capture register 204 has already stored the previously counted value before the capture register 204 receives the currently counted value. At the same time when the capture register 204 captures the value currently counted by the timer 203, the capture register 204 sends a counting value clear signal S83 to the timer 203 so that the timer 203 clears the current counting value to an initial value and automatically re-starts the counting operation. The capture register 204 also sends a valid state indication signal S81 to the filter circuit 260 so that the filter circuit 260 operates to allow transmission of the edge detection signal from the edge detection circuit 209 to capture register 204. If the value counted by the timer 203 exceeds the predetermined counting capability, then the timer 203 sends the timer overflow signal S80 to the capture register 204.

The compare register 250 is also connected to the edge detection circuit 209 for receiving the edge detection signal as the trigger signal. The compare register 250 also stores a predetermined critical frequency value so that the compare register 250 is operated to compare the edge detection signal received as the trigger signal with the predetermined critical frequency value stored therein. The compare register 250 is of a p-bit length (p≧1). The compare register 250 is also connected to the timer 203 for receiving the currently counted value from the timer 203. The compare register 250 is also connected to the capture register 204 for sending the currently counted value to the capture register 204.

If a frequency defined to be a rise-time or a fall-time of the edge detection signal received as the trigger signal is beyond the predetermined critical frequency value stored, then the compare register 250 sends an invalid state indication signal S82 to the filter circuit 260 so that the filter circuit 260 switches to discontinue the transmission of the edge detection signal as the trigger signal from the edge detection circuit 290 to the capture register 204. Since the capture register 204 receives no edge detection signal as the trigger signal, the capture register 204 does not capture the currently counted value supplied through the compare register 250 from the timer 203. If, however, the frequency defined to be a rise-time or a fall-time of the edge detection signal received as the trigger signal is not beyond the predetermined critical frequency value stored, then the compare register 250 does not send the invalid state indication signal S82 to the filter circuit 260 and the capture register 204 sends a valid state indication signal S81 to the filter circuit 260 so that the filter circuit 260 is operated to allow transmission of the edge detection signal from the edge detection circuit 209 to the capture register 204.

The period measuring circuit section 220 also has a random access memory 207 of z-bits (z≧1) which is connected to the central processing unit 200 for receiving the currently counted value which has now been captured by the capture register 204 to store the currently counted value.

Figure 6:
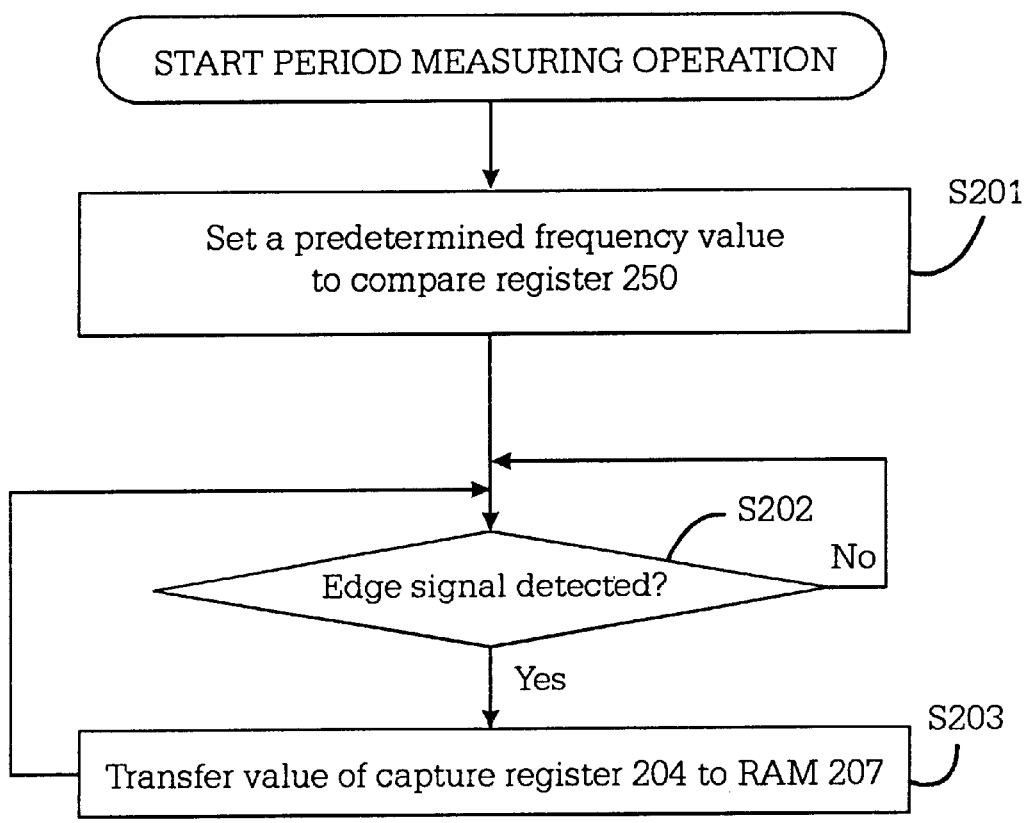
FIG. 6 is a flow chart illustrative of operations of the novel period measuring circuit of FIG. 4.

FIG. 6 is a flow chart illustrative of operations of the novel period measuring circuit of FIG. 4. With reference to FIG. 4, the operation of the period measuring circuit will be described as follows.

In a first step S201, after the period measuring operation has been started, then at first the central processing unit CPU 200 is operated to set the predetermined frequency critical value into the compare register 250.

In a second step S202, the edge detection circuit 109 monitors the input signal S1 having been inputted to the external trigger signal input terminal 101 in order to detect a predetermined waveform pulse signal, for example, a rising edge, a falling edge or both.

If the edge detection circuit 209 could confirm the predetermined waveform pulse signal, for example, the rising edge, the falling edge or both, then the edge detection circuit 209 sends the edge detection signal as the trigger signal both to the filter circuit 260 and to the compare register 250. The compare register 250 compares the edge detection signal received as the trigger signal with the predetermined critical frequency value, so that if a frequency defined to be a rise-time or a fall-time of the edge detection signal received as the trigger signal is beyond the predetermined critical frequency value stored, then the compare register 250 sends an invalid state indication signal S82 to the filter circuit 260 so that the filter circuit 260 switches to discontinue the transmission of the edge detection signal as the trigger signal from the edge detection circuit 290 to the capture register 204. As a result, if a pulse signal having shorter wavelength than a detectable wavelength range is applied to the external trigger signal input terminal 201 due to noise, then the period measuring operation is not executed. This means that if a pulse signal having a shorter wavelength than a detectable wavelength range is applied to the external trigger signal input terminal 201 due to noise, then no signal is sent to the capture register 204, whereby no period measuring operation is executed. This makes the central processing unit 200 free from any heavy burden for executing the period measuring operation.

Namely, as described above, if a frequency defined to be a rise-time or a fall-time of the edge detection signal received as the trigger signal is beyond the predetermined critical frequency value stored in the compare register 250, then the compare register 250 sends the invalid state indication signal S82 to the filter circuit 260 so that the filter circuit 260 switches to discontinue the transmission of the edge detection signal as the trigger signal from the edge detection circuit 290 to the capture register 204. Since the capture register 204 receives no edge detection signal as the trigger signal, the capture register 204 does not capture the currently counted value supplied through the compare register 250 from the timer 203.

If, however, the frequency defined to be a rise-time or a fall-time of the edge detection signal received as the trigger signal is not beyond the predetermined critical frequency value stored in the compare register 250, then the compare register 250 does not send the invalid state indication signal S82 to the filter circuit 260 and the capture register 204 sends a valid state indication signal S81 to the filter circuit 260 so that the filter circuit 260 is operated to allow transmission of the edge detection signal from the edge detection circuit 209 to the capture register 204. Only when the capture register 204 received the edge detection signal, the capture register 204 captures the currently counted value by the timer 203 and also sends a counting value clear signal S83 to the timer 203 so that the timer 203 clears the current count value to an initial value and automatically re-starts the counting operation. Further, simultaneously, the capture register 204 also sends a valid state indication signal S81 to the filter circuit 260 so that the filter circuit 260 is operated to allow transmission of the edge detection signal from the edge detection circuit 209 to the capture register 204. If the counted value by the timer 203 exceeds the predetermined counting capability, then the timer 203 sends the timer overflow signal S80 to the capture register 204 so that the capture register 204 captures the previously counted value by the timer 203.

In a third step S203, after the central processing unit 200 could confirm that the capture register 204 has executed the capturing operation, then the central processing unit 200 transfers the currently counted value stored in the capture register 204 to the random access memory RAM207 so that the random access memory RAM207 stores the currently counted value.

After the third step S203 was executed, then the frequency measuring process will back to the above second step S202 so that the edge detection circuit 109 again monitors the input signal S1 having been inputted to the external trigger signal input terminal 101 in order to detect a predetermined waveform pulse signal, for example, a rising edge, a falling edge or both.

From the above descriptions, it can be understood that the burdens of the central processing unit CPU 200 are only to set the predetermined frequency value in the compare register 250 in the first step S201 and also to transfer the currently counted value stored in the capture register 204. As compared to the conventional period measuring circuit, the above novel period measuring circuit section 220 provides a remarkable reduction in the burden of the central processing unit 200 for executing the frequency measuring processes.

The novel period measuring circuit section 220 provides the following effects and advantages.

By synchronizing with the capture trigger signal or the edge detection signal, the current counting value of the timer 203 is cleared and the counting operation of the timer 203 is re-started whereby it is possible to have the capture register store the currently counted value without execution of the subtraction operation by the central processing unit. This reduces the burden of the central processing unit.

The filter circuit 260 and the compare register 250 are provided to limit the frequency of the signal to be measured or to discontinue the transmission of the edge detection signal as the capture trigger signal from the edge detection circuit 209 to the capture register 204 when the frequency defined to be a rise-time or a fall-time of the edge detection signal received as the trigger signal is beyond the predetermined critical frequency value stored in the compare register 250. If a pulse signal having a shorter wavelength than a detectable wavelength range is applied to the external trigger signal input terminal 201 due to noise, then the period measuring operation is not executed. This means that if a pulse signal having a shorter wavelength than a detectable wavelength range is applied to the external trigger signal input terminal 201 due to noise, then no signal is sent to the capture register 204, whereby no period measuring operation is executed. This frees the central processing unit 200 from any heavy burden for executing the period measuring operation.

Further, the capture register 204 receives from the timer 203 the over-flow signal S80 as a capture trigger signal identifying that the timer 203 has fallen into the over-flow state. If the counted value by the timer 203 exceeds the predetermined counting capability, then the timer 203 sends the timer overflow signal S80 to the capture register 204 so that the capture register 204 captures the previously counted value by the timer 203. This makes it possible to have the central processing unit CPU 200 free from the requirement for monitoring the over-flow signal. This reduces the burden of the central processing unit CPU 200.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A period measuring circuit comprising:

a timer having as an input a timer count clock signal, said timer providing as an output a count value based on the timer count clock signal input, said timer performing a counting operation;

an input terminal receiving an input signal;

a detection circuit connected to the input terminal, the detection circuit detecting at least one of a rising edge and a falling edge of said input signal, said detection circuit providing as an output a detection signal; and a capture register having as an input the detection signal from said detection circuit through a control circuit, said capture register also having as an input said count value from said timer, said capture register storing the count value upon receipt of said detection signal;

wherein said control circuit compares a predetermined critical frequency value to a frequency of said detection signal, and wherein if said frequency of said detection signal is greater than said predetermined critical frequency value, then said control circuit disconnects said capture register from said detection circuit, and wherein if said frequency of said detection signal is not greater than said predetermined critical frequency value, then said control circuit connects said capture register to said detection circuit so that said capture register receives said detection signal and simultaneously sends a counting value clear signal to said timer so that said timer clears the count value to an initial value and subsequently re-starts its counting operation.

2. The period measuring circuit as claimed in claim 1, wherein said control circuit further comprises:

a filter circuit connected between said detection circuit and said capture register, and said filter circuit selectively connecting and disconnecting said capture register to said detection circuit; and a compare register connected to said detection circuit and also connected to said filter circuit, said compare register having said predetermined critical frequency value stored therein, said compare register performing the comparison of the frequency of said detection signal with said predetermined critical frequency value, if said frequency of said detection signal is greater than said predetermined critical frequency value, said compare register sending an invalid signal to said filter circuit so that said filter circuit is operated to disconnect said capture register from said detection circuit, and if said frequency of said detection signal is not greater than said predetermined critical frequency value, said compare register sending a valid signal to said filter circuit so that said filter circuit connects said capture register to said detection circuit.

3. The period measuring circuit as claimed in claim 1, wherein said timer has a predetermined counting capability so that if said count value exceeds said predetermined counting capability, said timer sends an over-flow signal to said capture register causing said capture register to maintain a previously stored count value from said timer.

4. A period measuring circuit comprising:

a first means for receiving a timer count clock signal, executing a counting operation, and providing a count value;

an input terminal;

a second means connected to the input terminal for receiving an input signal in order to detect at least one of a rising edge and a falling edge of said input signal and for providing a detection signal;

a third means being connected to said second means and also to said first means for storing the count value provided by said first means upon receipt of said detection signal from said second means; and a fourth means connected between said second means and said third means, said fourth means having a predetermined critical frequency value stored therein, said fourth means receiving said detection signal from said second means for comparison of a frequency of said detection signal with said predetermined critical frequency value and if said frequency of said detection signal is greater than said predetermined critical frequency value, then said fourth means disconnects said third means from said second means to discontinue period measuring operation, and if said frequency of said detection signal is not greater than said predetermined critical frequency value, then said fourth means connects said third means to said second means so that said third means receives said detection signal and simultaneously sends a counting value clear signal to said first means so that said first means clears the count value to an initial value and subsequently re-starts its counting operation.

5. The period measuring circuit as claimed in claim 4, wherein said fourth means comprises:

a fifth means being connected between said second means and said third means, and said fifth means being operated to selectively electrically connect and disconnect said third means to said second means; and a sixth means connected to said second means and also connected to said fifth means, said sixth means having said predetermined critical frequency value stored therein for said comparison of said frequency of said detection signal with said predetermined critical frequency value and if said frequency of said detection signal is greater than said predetermined critical frequency value, then said sixth means sends an invalid signal to said fifth means so that said fifth means is operated to disconnect said third means from said second means, and if said frequency of said detection signal is not greater than said predetermined critical frequency value, then said sixth means sends a valid signal to said fifth means so that said fifth means is operated to connect said third means to said second means whereby said second means receives said detection signal.

6. The period measuring circuit as claimed in claim 4, wherein said first means has a predetermined counting capability so that if said count value exceeds said predetermined counting capability, then said first means sends an over-flow signal to said third means causing said third means to maintain a previous count value from said first means.

7. A period measuring circuit comprising:

a timer having as an input a timer count clock signal, said timer providing as an output a count value based on the timer count clock signal input, said timer performing a counting operation;

an input terminal receiving an input signal;

a detection circuit connected to the input terminal, the detection circuit detecting at least one of a rising edge and a falling edge of said input signal, said detection circuit providing as an output a detection signal; and a capture register having as an input the detection signal from said detection circuit, said capture register also having as an input said count value from said timer, said capture register storing the count value upon receipt of said detection signal, wherein said capture register a counting value clear signal to said timer upon receipt of said detection signal, the counting value clear signal causing said timer to clear the count value to an initial value and restart the counting operation.

8. The period measuring circuit as claimed in claim 7, further comprising a control circuit connected between said detection circuit and said capture register, said control circuit comparing a predetermined critical frequency value to a frequency of said detection signal, wherein if said frequency of said detection signal is greater than said predetermined critical frequency value, then said control circuit disconnects said capture register from said detection circuit, and if said frequency of said detection signal is not greater than said predetermined critical frequency value, then said control circuit connects said capture register to said detection circuit so that said capture register receives said detection signal.

9. The period measuring circuit as claimed in claim 8, wherein said control circuit further comprises:
a filter circuit connected between said detection circuit and said capture register, and said filter circuit selectively connecting and disconnecting said capture register to said detection circuit; and
a compare register connected to said detection circuit and also connected to said filter circuit, said compare register having said predetermined critical frequency value stored therein, said compare register performing the comparison of the frequency of said detection signal with said predetermined critical frequency value, if said frequency of said detection signal is greater than said predetermined critical frequency value, said compare register sending an invalid signal to said filter circuit so that said filter circuit is operated to disconnect said capture register from said detection circuit, and if said frequency of said detection signal is not greater than said predetermined critical frequency value, said compare register sending a valid signal to said filter circuit so that said filter circuit connects said capture register to said detection circuit.

10. The period measuring circuit as claimed in claim 7, wherein said timer has a predetermined counting capability so that if said count value exceeds said predetermined counting capability, said timer sends an over-flow signal to said capture register, causing said capture register to maintain a previously stored count value from said timer.

11. A period measuring circuit comprising:
a first means for receiving a first means count clock signal, executing a counting operation and providing a count value;
an input terminal;
a second means connected to the input terminal for receiving an input signal in order to detect at least one of a rising edge and a falling edge of said input signal and for providing a detection signal; and
a third means connected to said second means and also to said first means for storing the count value provided by said first means upon receipt of said detection signal from said second means,
wherein said third means a counting value clear signal to said first means upon receipt of said detection signal, the counting value clear signal causing said first means to clear the count value to an initial value and restart the counting operation.

12. The period measuring circuit as claimed in claim 11, further comprising a fourth means connected between said second means and said third means, said fourth means having a predetermined critical frequency value stored therein, said fourth means receiving said detection signal from said second means for comparison of a frequency of said detection signal with said predetermined critical frequency value and if said frequency of said detection signal is greater than said predetermined critical frequency value, then said fourth means disconnects said third means from said second means to discontinue period measuring operation, and if said frequency of said detection signal is not greater than said predetermined critical frequency value, then said fourth means connects said third means to said second means so that said third means receives said detection signal.

13. The period measuring circuit as claimed in claim 11, wherein said fourth means comprises:

a fifth means connected between said second means and said third means, and said fifth means being operated to selectively electrically connect and disconnect said third means to said second means; and
a sixth means connected to said second means and also connected to said fifth means, said sixth means having said predetermined critical frequency value stored therein for said comparison of said frequency of said detection signal with said predetermined critical frequency value and if said frequency of said detection signal is greater than said predetermined critical frequency value, then said sixth means sends an invalid signal to said fifth means so that said fifth means is operated to disconnect said third means from said second means, and if said frequency of said detection signal is not greater than said predetermined critical frequency value, then said sixth means sends a valid signal to said fifth means so that said fifth means is operated to connect said third means to said second means whereby said third means receives said detection signal.

14. The period measuring circuit as claimed in claim 11, wherein said first means has a predetermined counting capability so that if said count value exceeds said predetermined counting capability, then said first means sends an over-flow signal to said third means causing said third means to maintain a previous count value from said first means.

15. A period measuring circuit comprising:
a timer having as an input a timer count clock signal, said timer providing as an output a count value based on the timer count clock signal input, said timer performing a counting operation;
an input terminal receiving an input signal;
a detection circuit connected to the input terminal, the detection circuit detecting at least one of a rising edge and a falling edge of said input signal, said detection circuit providing as an output a detection signal; and
a capture register having as an input the detection signal from said detection circuit, said capture register also having as an input said count value from said timer, said capture register storing the count value upon receipt of said detection signal,
wherein said timer has a predetermined counting capability so that if said count value exceeds said predetermined counting capability, said timer sends an over-flow signal to said capture register causing said capture register to maintain a previously stored value from said timer.

16. The period measuring circuit as claimed in claim 15, wherein said capture register to a counting value clear signal to said timer upon receipt of said detection signal, the counting value clear signal causing said timer to clear the count value to an initial value and restart the counting operation.

17. The period measuring circuit as claimed in claim 16, further comprising a control circuit connected between said detection circuit and said capture register, said control circuit comparing a predetermined critical frequency value to a frequency of said detection signal, wherein if said frequency of said detection signal is greater than said predetermined critical frequency value, then said control circuit disconnects said capture register from said detection circuit, and if said frequency of said detection signal is not greater than said predetermined critical frequency value, then said control circuit connects said capture register to said detection circuit so that said capture register receives said detection signal.

18. The period measuring circuit as claimed in claim 17, wherein said control circuit further comprises:
- a filter circuit connected between said detection circuit and said capture register, and said filter circuit selectively connecting and disconnecting said capture register to said detection circuit; and
- a compare register connected to said detection circuit and also connected to said filter circuit, said compare register having said predetermined critical frequency value stored therein, said compare register performing the comparison of the frequency of said detection signal with said predetermined critical frequency value, if said frequency of said detection signal is greater than said predetermined critical frequency value, said compare register sends an invalid signal to said filter circuit so that said filter circuit is operated to disconnect said capture register from said detection circuit, and if said frequency of said detection signal is not greater than said predetermined critical frequency value, said compare register sends a valid signal to said filter circuit so that said filter circuit connects said capture register to said detection circuit.

19. A period measuring circuit comprising:
- a first means for receiving a first means count clock signal, executing a counting operation, and providing a count value;
- an input terminal;
- a second means connected to the input terminal for receiving an input signal in order to detect at least one of a rising edge and a falling edge of said input signal and for providing a detection signal; and
- a third means connected to said second means and also to said first means for storing the count value provided by said first means upon receipt of said detection signal from said second means,
- wherein said first means has a predetermined counting capability so that if said count value exceeds said predetermined counting capability, then said first means sends an over-flow signal to said third means causing said third means to maintain a previous count value from said first means.

20. The period measuring circuit as claimed in claim 19, wherein said third means a counting value clear signal to said first means upon receipt of said detection signal, the counting value clear signal causing said first means to clear the count value to an initial value and restart the counting operation.

21. The period measuring circuit as claimed in claim 20, further comprising a fourth means connected between said second means and said third means, said fourth means having a predetermined critical frequency value stored therein said fourth means receiving said detection signal from said second means for comparison of a frequency of said detection signal with said predetermined critical frequency value and if said frequency of said detection signal is greater than said predetermined critical frequency value, then said fourth means disconnects said third means from said second means to discontinue period measuring operation, and if said frequency of said detection signal is not greater than said predetermined critical frequency value, then said fourth means connects said third means to said said second means so that said third means receives said detection signal.

22. The period measuring circuit as claimed in claim 21, wherein said fourth means further comprises:
- a fifth means connected between said second means and said third means, and said fifth means being operated to selectively electrically connect and disconnect said third means to said second means; and
- a sixth means connected to said second means and also connected to said fifth means, said sixth means having said predetermined critical frequency value stored therein for said comparison of said frequency of said detection signal with said predetermined critical frequency value and if said frequency of said detection signal is greater than said predetermined critical frequency value, then said sixth means sends an invalid signal to said fifth means so that said fifth means is operated to disconnect said third means from said second means, and if said frequency of said detection signal is not greater than said predetermined critical frequency value, then said sixth means sends a valid signal to said fifth means so that said fifth means is operated to connect said third means to said second means whereby said third means receives said detection signal.

* * * * *